United States Patent
Segawa et al.

(10) Patent No.: US 9,710,050 B2
(45) Date of Patent: Jul. 18, 2017

(54) INFORMATION PROCESSING DEVICE, SEMICONDUCTOR CHIP, INFORMATION PROCESSING METHOD, AND COMPUTER PROGRAM PRODUCT

(71) Applicant: KABUSHIKI KAISHA TOSHIBA, Minato-ku, Tokyo (JP)

(72) Inventors: Junichi Segawa, Kanagawa (JP); Tatsunori Kanai, Kanagawa (JP); Tetsuro Kimura, Tokyo (JP); Koichi Fujisaki, Kanagawa (JP); Masaya Tarui, Kanagawa (JP); Satoshi Shirai, Kanagawa (JP); Hiroyoshi Haruki, Kanagawa (JP); Yusuke Shirota, Kanagawa (JP); Akihiro Shibata, Tokyo (JP); Shiyo Yoshimura, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 117 days.

(21) Appl. No.: 14/637,499

(22) Filed: Mar. 4, 2015

(65) Prior Publication Data
US 2015/0262715 A1     Sep. 17, 2015

(30) Foreign Application Priority Data
Mar. 12, 2014  (JP) ................. 2014-049483

(51) Int. Cl.
*G06F 12/06*      (2006.01)
*G06F 1/32*       (2006.01)
(Continued)

(52) U.S. Cl.
CPC ............ *G06F 1/3268* (2013.01); *G06F 1/325* (2013.01); *G06F 1/3206* (2013.01);
(Continued)

(58) Field of Classification Search
CPC .................................. G11C 7/04; G06F 12/06
See application file for complete search history.

(56) References Cited

U.S. PATENT DOCUMENTS 4,455,453 A * 6/1984 Parasekvakos ...... H04M 11/002
                                                    340/3.3
6,597,529 B1 * 7/2003 DeRosa ............... G11B 5/5547
                                                   360/78.04
(Continued)

FOREIGN PATENT DOCUMENTS

JP    2004-234622    8/2004
JP    2011-047252    3/2011
(Continued)

*Primary Examiner* — Mohammed Rehman
(74) *Attorney, Agent, or Firm* — Amin, Turocy & Watson LLP

(57) ABSTRACT

According to an embodiment, an information processing device includes a data obtaining unit and a data storage controller. The data obtaining unit is configured to obtain data measured by a sensor. The data storage controller is configured to store the data obtained by the data obtaining unit in a first memory of volatile nature when a sampling interval indicating an interval at which the data obtaining unit obtains the data is equal to or smaller than a threshold value. The data storage controller is configured to store the data obtained by the data obtaining unit and the data stored in the first memory in a second memory of nonvolatile nature when the sampling interval exceeds the threshold value.

6 Claims, 10 Drawing Sheets

(51) Int. Cl.

| | | |
|---|---|---|
| *G11C 7/04* | (2006.01) | |
| *G11C 11/00* | (2006.01) | |
| *G11C 16/34* | (2006.01) | |

(52) U.S. Cl.
CPC .......... *G06F 1/3275* (2013.01); *G06F 1/3287* (2013.01); *G11C 7/04* (2013.01); *G11C 11/005* (2013.01); *G11C 16/349* (2013.01)

(56) References Cited

U.S. PATENT DOCUMENTS

| | | | |
|---|---|---|---|
| 8,832,335 B2 | 9/2014 | Shibata et al. | |
| 8,868,952 B2 | 10/2014 | Haruki et al. | |
| 8,880,914 B2 | 11/2014 | Fujisaki et al. | |
| 2004/0116786 A1 | 6/2004 | Iijima et al. | |
| 2005/0231350 A1* | 10/2005 | Littrell | G01H 1/006 340/511 |
| 2006/0045215 A1* | 3/2006 | Ballantyne | G04G 3/00 375/344 |
| 2007/0112955 A1* | 5/2007 | Clemm | H04L 43/0817 709/224 |
| 2012/0246390 A1 | 9/2012 | Kanai et al. | |
| 2013/0073812 A1 | 3/2013 | Kanai et al. | |
| 2013/0080812 A1 | 3/2013 | Shirota et al. | |
| 2013/0080813 A1 | 3/2013 | Tarui et al. | |
| 2013/0091372 A1 | 4/2013 | Kimura et al. | |
| 2013/0187694 A1* | 7/2013 | Joung | H03H 17/0027 327/159 |
| 2013/0191670 A1 | 7/2013 | Haruki et al. | |
| 2013/0219203 A1 | 8/2013 | Fujisaki et al. | |
| 2013/0254773 A1 | 9/2013 | Kimura et al. | |
| 2013/0268781 A1 | 10/2013 | Kanai et al. | |
| 2014/0013138 A1 | 1/2014 | Kanai et al. | |
| 2014/0013140 A1 | 1/2014 | Segawa et al. | |
| 2014/0075227 A1* | 3/2014 | Shirota | G06F 1/324 713/323 |
| 2014/0077604 A1 | 3/2014 | Shibata et al. | |
| 2014/0089715 A1 | 3/2014 | Kimura et al. | |
| 2014/0139500 A1 | 5/2014 | Kimura et al. | |
| 2014/0172400 A1* | 6/2014 | Majewski | G06F 17/5009 703/18 |
| 2014/0240333 A1 | 8/2014 | Shirota et al. | |
| 2014/0245039 A1 | 8/2014 | Segawa et al. | |
| 2014/0245045 A1 | 8/2014 | Haruki et al. | |
| 2014/0245047 A1 | 8/2014 | Yoshimura et al. | |
| 2015/0019895 A1 | 1/2015 | Fujisaki et al. | |
| 2015/0084892 A1 | 3/2015 | Shirota et al. | |
| 2015/0089261 A1 | 3/2015 | Segawa et al. | |
| 2015/0177716 A1* | 6/2015 | Hyman | G05B 15/02 700/275 |
| 2015/0228047 A1* | 8/2015 | Shirota | G06T 1/20 345/522 |
| 2015/0261283 A1 | 9/2015 | Fujisaki et al. | |
| 2015/0262715 A1 | 9/2015 | Segawa et al. | |
| 2016/0020696 A1 | 1/2016 | Shibata et al. | |
| 2016/0080652 A1 | 3/2016 | Shirota et al. | |
| 2016/0085292 A1 | 3/2016 | Fujisaki et al. | |

FOREIGN PATENT DOCUMENTS

| | | |
|---|---|---|
| JP | 2012-203518 | 10/2012 |
| JP | 2015-152693 | 8/2015 |
| JP | 2015-176158 | 10/2015 |
| JP | 2015-176214 | 10/2015 |
| JP | 2015-179992 | 10/2015 |
| JP | 2016-25748 | 2/2016 |
| JP | 2016-62148 | 4/2016 |
| JP | 2016-62348 | 4/2016 |

* cited by examiner

INFORMATION PROCESSING DEVICE, SEMICONDUCTOR CHIP, INFORMATION PROCESSING METHOD, AND COMPUTER PROGRAM PRODUCT

CROSS-REFERENCE TO RELATED APPLICATION

This application is based upon and claims the benefit of priority from Japanese Patent Application No. 2014-049483, filed on Mar. 12, 2014; the entire contents of which are incorporated herein by reference.

FIELD

Embodiments described herein relate generally to information processing devices, semiconductor chips, information processing methods, and computer program products.

BACKGROUND

Typically, there are known computers for processing data related to the temperature, the humidity, or the acceleration measured by sensors. The sampling interval indicates the waiting duration between the timings of obtaining sensing data. In some cases the sampling interval is relatively longer and in other cases it is relatively shorter. In that regard, a technology is already known for changing the sampling interval duration depending on the situation.

Typically, in order to avoid loss of data that is measured using the sensors, the data is often stored in a nonvolatile memory. However, if, every time the data is obtained from the sensor, that data is stored in a nonvolatile memory; then a lot of small writing processes performed.

DETAILED DESCRIPTION

According to an embodiment, an information processing device includes a data obtaining unit and a data storage controller. The data obtaining unit is configured to obtain data measured by a sensor. The data storage controller is configured to store the data obtained by the data obtaining unit in a first volatile memory when a sampling interval is equal to or smaller than a threshold value. The data storage controller is configured to store the data obtained by the data obtaining unit and the data stored in the first memory in a second nonvolatile memory when the sampling interval exceeds the threshold value.

Exemplary embodiments of an information processing device, a semiconductor chip, an information processing method, and a computer program product are described below in detail with reference to the accompanying drawings.

First Embodiment

Figure 1:
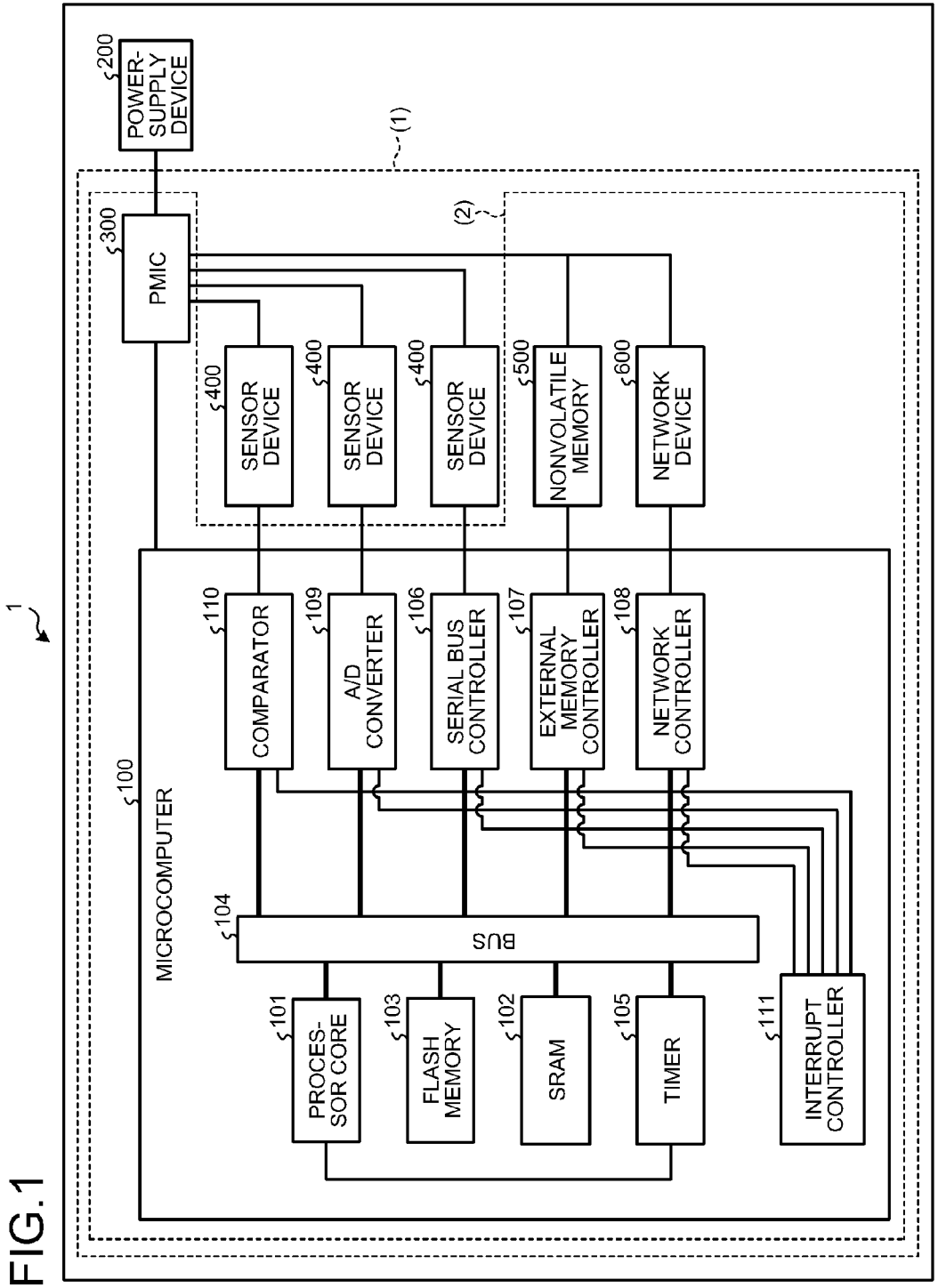
FIG. 1 is a diagram illustrating a configuration example of a sensor-equipped terminal according to a first embodiment.

FIG. 1 is a diagram illustrating an exemplary hardware configuration of a sensor-equipped terminal 1. As illustrated in FIG. 1, the sensor-equipped terminal 1 includes a microcomputer 100, a power-supply device 200, a power management IC (PMIC) 300, one or more (in the example illustrated in FIG. 1, three) sensor devices 400, a nonvolatile memory 500, and a network device 600. However, the configuration is not limited to this example. In this example, each sensor device 400 may be simply referred to as a "sensor". Meanwhile, as illustrated by a dashed-line (1) in FIG. 1, the configuration can be such that the sensor-equipped terminal 1 uses the power-supply device 200 installed on the outside. Moreover, as illustrated by a dashed line (2) in FIG. 1, the configuration can be such that the sensor-equipped terminal 1 processes data measured by the sensor devices 400 that are installed on the outside. Furthermore, although not illustrated in FIG. 1, the configuration can be such that the nonvolatile memory 500 and the network device 600 are external devices.

Firstly, the explanation is given about the microcomputer 100. Herein, the microcomputer 100 performs computations with respect to the data measured by the sensor devices 400 as well as controls the sensor-equipped terminal 1 in entirety. In the example illustrated in FIG. 1, the microcomputer 100 includes the following internal modules: a processor core 101; a static random access memory (SRAM) 102 that is a volatile memory; a flash memory 103 that is a nonvolatile memory (instead of a flash memory, it is also possible to use a ferroelectric random access memory (FeRAM) or a magneto-resistive random access memory (MRAM) as the nonvolatile memory); a bus 104 that performs data communication between the internal modules; a timer 105; a serial bus controller 106 such as I2C, SPI, UART, or GPIO that is used in data communication with the sensor devices 400; an external memory controller 107 that controls the nonvolatile memory 500; a network controller 108 that controls the network device 600; an analog-to-digital (A/D) converter 109; a comparator 110; and an interrupt controller 111. However, some of these modules may not be embedded in the microcomputer 100. For example, in the first embodiment, the configuration can be such that the comparator 110 is not embedded in the microcomputer 100.

In the first embodiment, the microcomputer 100 is configured with a single-chip IC (a semiconductor integrated circuit) in which a plurality of semiconductor elements (semiconductor components) is integrated in a single silicon die. However, that is not the only possible case. Alternatively, for example, a plurality of semiconductor components constituting the microcomputer 100 can be installed in a dispersed manner in a plurality of silicon dies.

The microcomputer 100 has a power saving mode that enable achieving reduction in the power consumption. In this example, the processor core 101 has two states, namely, a running state in which instructions (programs) are executed and an idle state (a state of non-execution of instructions) in which the processor core 101 waits for an interrupt from the timer 105. In the idle state, the power consumption can be reduced by switching to the power saving mode. In order to switch to the power saving mode, the processor core 101 executes a wait for interrupt (WFI) instruction. The power saving mode has a plurality of types; and disabling more functions enables achieving more reduction in the power consumption. Examples of the types of the power saving mode include a SLEEP mode in which the clock supply to the processor core 101 is stopped so as to reduce the power consumption, and a DEEP SLEEP mode in which the power consumption is further reduced by stopping the processor core 101, stopping the power supply to the embedded SRAM 102, keeping the voltage at a low level, and enabling only the minimum possible functions that are returnable in response to an interrupt. Regarding the type of the power saving mode to enter in response to the execution of a WFI request, the processor core 101 specifies the type by setting the corresponding value in a dedicated control register (not illustrated). Regarding returning from the power saving mode (i.e., regarding returning to an instruction executable state), when the interrupt controller 111 receives an interrupt signal (can also be thought to be a signal that requests execution of interrupt processing), returning from the power saving mode is done.

An interrupt signal is generated by, for example, the timer 105, the A/D converter 109, the comparator 110, or the serial bus controller 106 and is then transmitted to the interrupt controller 111. The timer 105 can generate an interrupt signal when the set time is reached. The A/D converter 109 can generate an interrupt signal at the point of time at which, for example, the analog data that has been input is completely converted into digital data. The comparator 110 can generate an interrupt signal when an input value is greater than a threshold value or when the input value is smaller than the threshold value. The serial bus controller 106 can generate an interrupt signal when the input value is a specified value (logical HIGH or logical LOW) or when the input value is changed to a specified value (i.e., changed from logical HIGH to logical LOW, or changed from logical LOW to logical HIGH).

The interrupt controller 111 sets, in an internal register, an interrupt vector corresponding to the interrupt signal that is received; and notifies the processor core 101 about the occurrence of an interrupt. Upon receiving the notification, the processor core 101 returns from the power saving mode, refers to the register of the interrupt controller 111, obtains the value of the interrupt vector, and executes an interrupt handler (a program) corresponding to the obtained interrupt vector. Once the interrupt handler is executed, the microcomputer 100 can be configured to automatically switch to the power saving mode.

Given below is the explanation of the power-supply device 200. Herein, as the power-supply device 200, it is possible to use various types of devices. For example, it is possible to use a primary battery such as an alkaline manganese battery; a secondary battery such as a nickel-metal-hydride battery; or a combination of a power-generating equipment and an electrical storage device, such as an energy harvesting device. Examples of an energy harvesting device include a photovoltaic cell in which light energy is used or a power harvesting device in which heat energy or vibrational energy is used. In case the electrical power generated by an energy harvesting device is not sufficient to cover the power consumption at the peak of the operations performed by the sensor-equipped terminal 1, then the surplus electricity during the periods of less power consumption can be stored in the electrical storage device and can be used to cover the electrical power required at the peak hour. Such a usage of the electrical power is called peak assist. Examples of the electrical storage device include a high-capacity capacitor such as an electrical double layer capacitor or a lithium-ion capacitor, and a battery such as a lithium-ion battery. Alternatively, the electrical storage device can be configured using the combination of a high-capacity capacitor and a battery. If it is possible to use an AC power supply, the battery can be replaced with the AC power supply.

Figure 2:
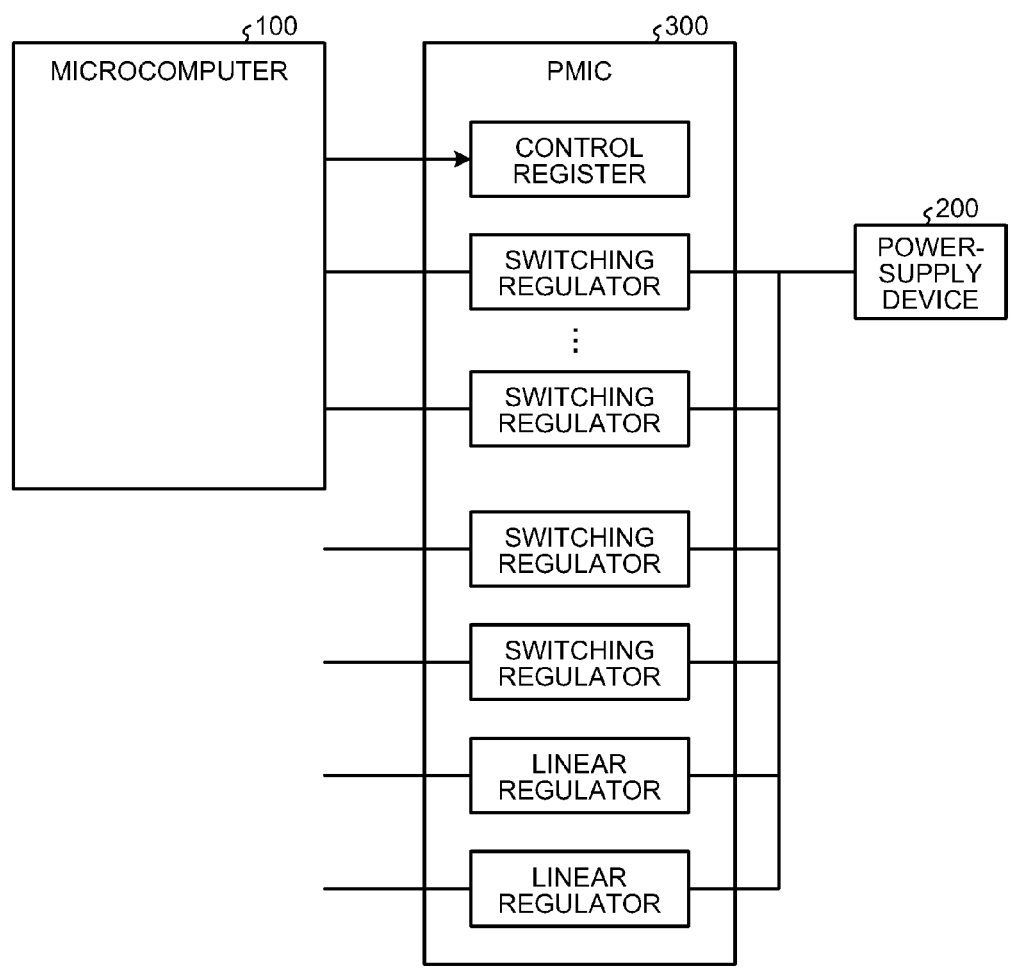
FIG. 2 is a diagram illustrating a configuration example of a power management IC (PMIC) according to the first embodiment.

Given below is the explanation of the PMIC 300. Herein, the PMIC 300 converts the electrical power, which is supplied by the power-supply device 200, into the voltages required by the microcomputer 100, the sensor devices 400, the nonvolatile memory 500, and the network device 600, and supplies the voltages to the constituent elements. FIG. 2 is a diagram illustrating an exemplary configuration of the PMIC 300. Herein, the PMIC 300 has one or more built-in regulators of different types, such as a plurality of switching regulators or a plurality of linear regulators. With that, the PMIC 300 converts the input voltage, which is supplied from the power-supply device 200, into the voltage corresponding to each power-supply line. Moreover, the PMIC 300 has built-in control registers that are used to store information indicating the output voltage to be set for each power-supply line. Thus, the output voltage of the regulator of each power-supply line can be set in the corresponding control register. In addition, the PMIC 300 can also be used to store information indicating the output voltage of the regulator of each power-supply line and indicating the ON/OFF control of the power supply at the time when an STBY signal is received as a notification of the mode (the state) of the sensor-equipped terminal 1 (or the microcomputer 100). According to such setting, for example, if an STBY signal is used to notify the PMIC 300 that the microcomputer 100 has switched to the DEEP SLEEP mode, then the PMIC 300 either can change the output voltage of each power-supply line to the specified voltage or can stop the power supply.

The microcomputer 100 and the PMIC 300 are connected to each other by a serial bus such as I2C or SPI. Thus, in the control registers in the PMIC 300, the values can be set from the microcomputer 100 via the serial bus. Meanwhile, instead of configuring the PMIC 300 using the components integrated in a single chip, it is also possible to use a combination of a plurality of DC/DC converters (chips or modules). The microcomputer 100 is equipped with some or all of the functions of the PMIC 300. That is, the microcomputer 100 can have DC/DC converters and regulators as built-in components so that the ON/OFF control of the power supply and changes in the voltage can be done internally in the microcomputer 100. In such a case, the microcomputer 100 equipped with some or all of the functions of the PMIC 300 can be configured with a single-chip IC.

Given below is the explanation of the sensor devices 400. Herein, various types of sensors can be used as the sensor devices 400. For example, in the sensor-equipped terminal 1 aimed at healthcare, it is often the case that pulse sensors, temperature sensors, humidity sensors, or acceleration sensors are used as the sensor devices 400 for the purpose of obtaining vital data (biological data). Moreover, in the sensor-equipped terminal 1 aimed at infrastructure, it is often the case that temperature sensors, acceleration sensors, geomagnetism sensors, pressure sensors, or gradient sensors are used as the sensor devices 400. Besides, it is also possible to use sensors of other types than the types mentioned above.

These sensor devices 400 can convert measured physical data into voltage values and output the voltage values to the microcomputer 100. Then, the microcomputer 100 converts the voltage values, which are output by the sensor devices 400, into digital data using the A/D converter 109 and obtains (reads) the digital data. In this example, the digital data obtained by conversion by the A/D converter 109 can be considered to be the data measured by the sensor devices 400 (in the following explanation, sometimes referred to as "sensor data").

Meanwhile, using the comparator 110, the microcomputer 100 can distinguish whether the data measured by the sensor devices 400 has exceeded a threshold value or smaller than a threshold value. In this example, the analog voltage signals input to the comparator 110 (i.e., the voltage signals corresponding to the physical data measured by the sensor devices 400) can be considered to be the sensor data measured by the sensor devices 400. Alternatively, the digital data that is obtained by A/D conversion of the analog voltage signals can also be considered to be the sensor data measured by the sensor devices 400.

Depending on the type of the sensor devices 400, physical data is output as resistance values, current values, or electrostatic capacitances. The physical data output from such sensor devices 400 can be converted into voltage values using a voltage conversion circuit, and the voltage values can be obtained.

Moreover, depending on the type of the sensor devices 400, they are compatible to the serial bus controller 106 such as I2C, SPI, or GPIO. These sensor devices 400 internally convert the measured data into digital data and output the digital data to the serial bus controller 106. Thus, the microcomputer 100 can obtain the data measured by the sensor devices 400 (i.e., can obtain the digital data) using (via) the serial bus controller 106.

Given below is the explanation of the nonvolatile memory 500. Herein, the nonvolatile memory 500 is used to store a variety of data (for example, sensor data). The nonvolatile memory 500 can be configured with, for example, a NAND flash memory, a NOR flash memory, a ferroelectric random access memory (FeRAM), a resistance random access memory (ReRAM), a magneto-resistive random access memory (MRAM), or a phase change memory (PCM). However, that is not the only possible case, and the nonvolatile memory 500 can be configured in an arbitrary manner. In the example illustrated in FIG. 1, the nonvolatile memory 500 is installed on the outside of the microcomputer 100. However, that is not the only possible case. Alternatively, the nonvolatile memory 500 can be installed inside the microcomputer 100.

Given below is the explanation of the network device 600. Herein, as the network device (communication device) 600, it is possible to use devices implementing various communication methods. For example, it is possible to use a wired LAN device such as Ethernet (registered trademark); a wireless LAN device having the transmission standard of 802.11a/802.11b/802.11g/802.11n/802.11ac; or a device for near field transmission such as Bluetooth, ZigBee (registered trademark), and TransferJet.

In the first embodiment, reduction in the power consumption is achieved by executing a computer program written for obtaining and storing the data measured (sensed) by the sensor devices 400 of the sensor-equipped terminal 1 and for controlling the power saving mode of the microcomputer 100. This computer program, which is hereinafter simply referred to as the "program", is stored in a nonvolatile memory such as the flash memory 103 that is embedded in the microcomputer 100. When the processor core 101 is powered on or is reset, it reads the program from the flash memory 103 and starts executing the program. The program may sometimes be included in an application or may sometimes be included in an operating system (OS).

Figure 3:
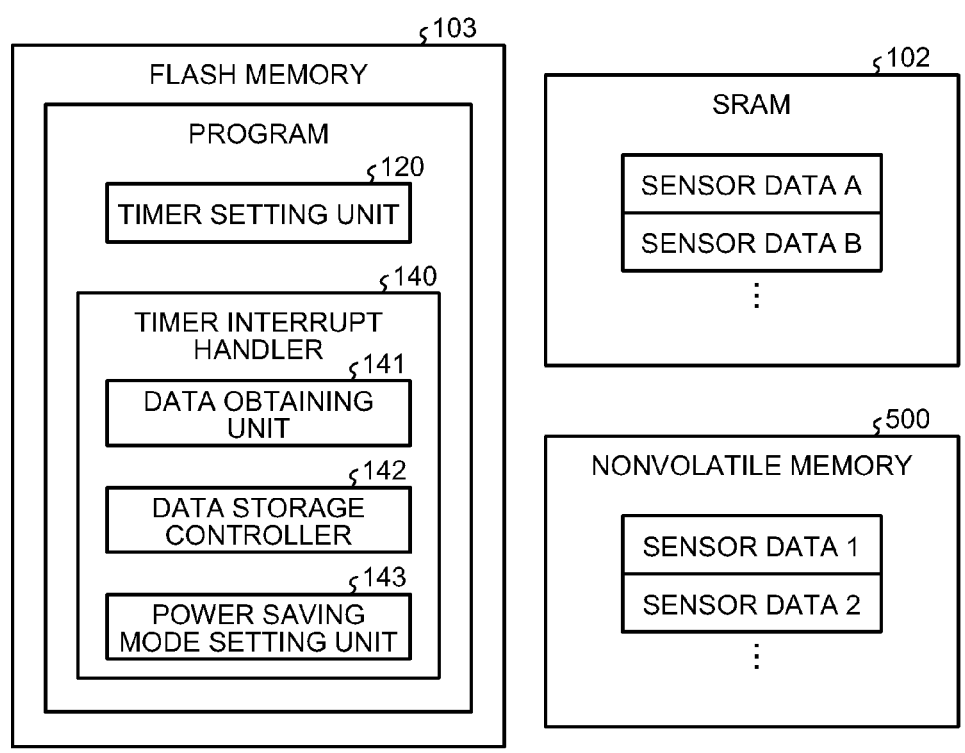
FIG. 3 is a schematic diagram illustrating a configuration example of a program according to the first embodiment.

FIG. 3 is a schematic diagram illustrating a configuration example of the program executed by the processor core 101 according to the first embodiment. The program includes a timer setting unit 120, which sets the time for the timer 105 to generate an interrupt (can be considered to be the time at which the timer 105 generates an interrupt signal), and a timer interrupt handler 140, which represents the operation executed in response to an interrupt generated by the timer 105.

The functions of the timer setting unit 120 are implemented when the processor core 101 executes a program corresponding to the timer setting unit 120 (i.e., a program written for implementing the functions of the timer setting unit 120). The timer setting unit 120 also has the function of setting the sampling interval according to sensor data obtained by a data obtaining unit 141 (described later). The related details are given later. Meanwhile, in this example, the timer setting unit 120 may be referred to as a "setting unit".

When the processor core 101 executes the timer interrupt handler 140, the functions of the data obtaining unit 141, a data storage controller 142, and a power saving mode setting unit 143 are implemented.

The data obtaining unit 141 obtains sensor data from the sensor devices 400. Herein, the data obtaining unit 141 either can obtain the sensor data via the serial bus controller 106 such as an I2C, SPI, or a GPIO, or can obtain the sensor data in the form of the digital data obtained by conversion by the A/D converter 109.

The data storage controller 142 performs control in such a way that, when the sampling interval indicating the interval at which the data obtaining unit 141 obtains the sensor data is equal to or smaller than a threshold value, the sensor data obtained by the data obtaining unit 141 is stored in the SRAM 102 that is embedded in the microcomputer 100, and, when the sampling interval exceeds the threshold value, the sensor data obtained by the data obtaining unit 141 and the sensor data stored at that point of time in the SRAM 102 is clubbed together and stored in the nonvolatile memory 500. The related details are given later.

In this example, the SRAM 102 embedded in the microcomputer 100 may be referred to as a "first memory", and the nonvolatile memory 500 may be referred to as a "second memory". However, that is not the only possible case. Alternatively, for example, the data storage controller 142 can be configured to perform control in such a way that, when the sampling interval exceeds a threshold value, at least some of the data formed by clubbing the sensor data obtained by the data obtaining unit 141 and the sensor data stored at that point of time in the SRAM 102 is stored in the flash memory 103 that is embedded in the microcomputer 100. In this case, the flash memory 103 embedded in the microcomputer 100 may be referred to as the "second memory".

The power saving mode setting unit 143 sets the power saving mode of the microcomputer 100. The related details are given later.

Figure 4:
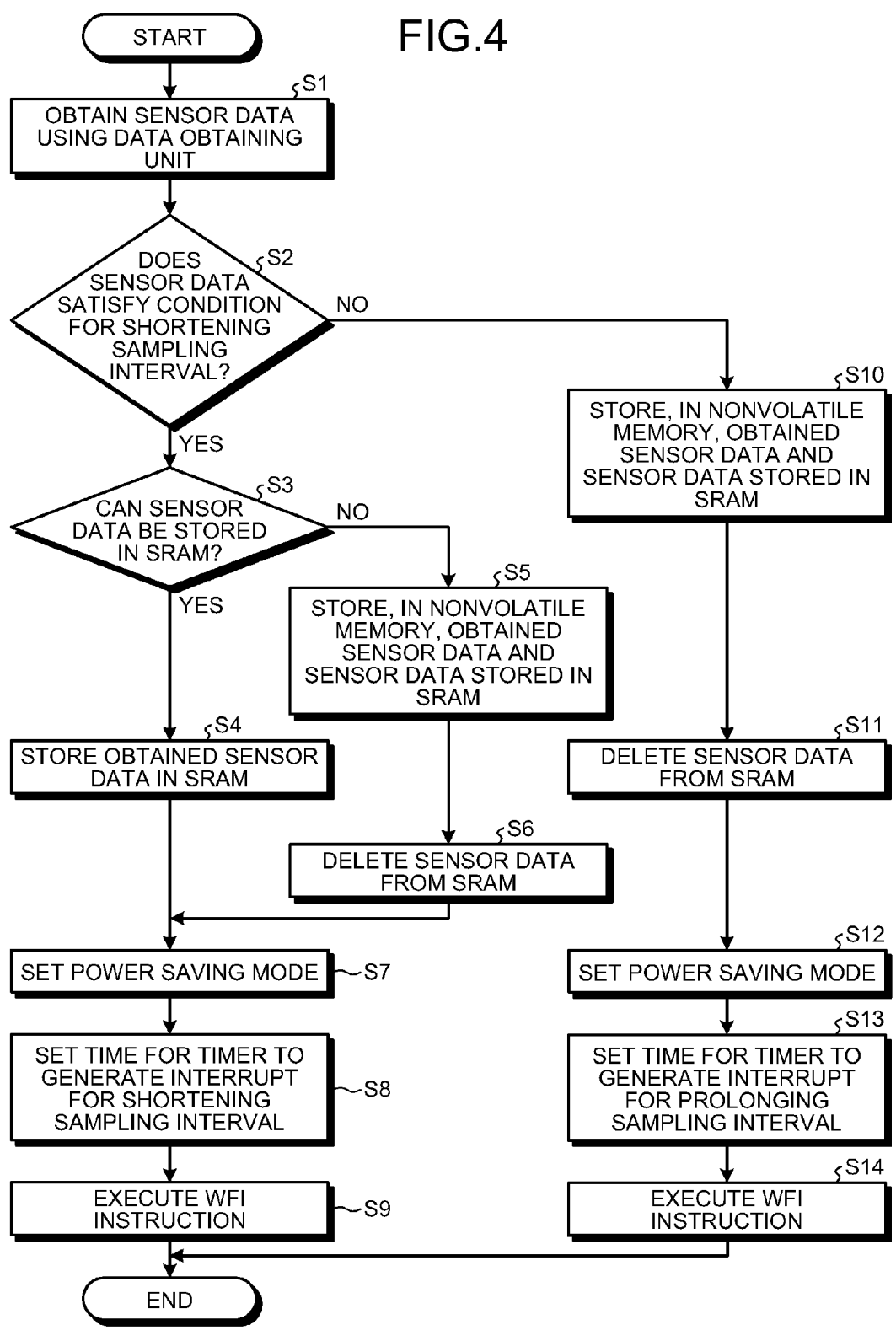
FIG. 4 is a flowchart for explaining an example of operations performed according to the program according to the first embodiment.

Explained below with reference to FIG. 4 is the explanation of an example of operations performed according to the program stored in the flash memory 103. FIG. 4 is a flowchart for explaining an example of operations performed according to the program. When the time is reached for the timer 105 to generate an interrupt (i.e., when the time set by the timer setting unit 120 is reached), the timer 105 generates an interrupt. In response, the microcomputer 100 returns from the power saving mode and the processor core 101 starts the execution of the timer interrupt handler 140. As illustrated in FIG. 4, firstly, the data obtaining unit 141 obtains the sensor data (Step S1).

Then, the data obtaining unit 141 removes noise from the sensor data as may be necessary, and determines whether or not the sensor data satisfies a condition for shortening the sampling interval (Step S2).

As far as the condition for shortening the sampling interval is concerned, it is possible to think of various conditions depending on the usage of the sensor-equipped terminal 1. For example, in the field of healthcare, if active data is to be obtained frequently, then the setting can be done in such a way that the value of the sensor data measured by an acceleration sensor satisfies the condition for shortening the sampling interval when exceeding a threshold value but does not satisfy the condition when equal to or smaller than the threshold value. That is, the situation of the value of sensor data exceeding the threshold value can also be set as the condition for shortening the sampling interval. Moreover, for example, if the data during sleep hours is to be obtained, the setting can be done in such a way that the value of the sensor data measured by an acceleration sensor satisfies the condition for shortening the sampling interval when equal to or smaller than a threshold value but does not satisfy the condition when exceeding the threshold value. That is, in an opposite manner to the previous setting, the situation of the value of sensor data being equal to or smaller than the threshold value can be set as the condition for shortening the sampling interval.

In the field of infrastructure, for example, if the data is to be obtained on a frequent basis when there are large vibrations, the setting can be done in such a way that the value of the sensor data measured by a vibration meter satisfies the condition for shortening the sampling interval when exceeding a threshold value but does not satisfy the condition when equal to or smaller than the threshold value. That is, the situation of the value of sensor data exceeding the threshold value can be set as the condition for shortening the sampling interval. Moreover, there may be a configuration in which the sensor data measured by a plurality of sensor devices 400 is used and, for example, if the focus is on finding out the status in the rain, the setting can be done in the following manner: when the value of the sensor data measured by a humidity sensor exceeds a threshold value and when the value of the sensor data measured by an acceleration sensor exceeds a threshold value, the sensor data satisfies the condition for shortening the sampling interval. However, if one of the two sensor data values is equal to or smaller than the corresponding threshold value, then the sensor data does not satisfy the condition for shortening the sampling interval. The configuration can also be such that whether or not the sensor data satisfies the condition for shortening the sampling interval is determined not only using the currently-obtained sensor data but also based on statistical information of all sensor data obtained till now.

In this way, as the condition for whether or not to shorten the sampling interval, there may be various conditions depending on the types of the sensor devices 400 and depending on the applications. Meanwhile, in this example, although it is determined whether or not the obtained sensor data satisfies the condition for shortening the sampling interval; that is not the only possible case. Alternatively, for example, the configuration can be such that the function of determining whether or not the sensor data, which is obtained by the data obtaining unit 141, satisfies the condition for shortening the sampling interval is provided separately from the data obtaining unit 141. In essence, in response to the execution of the timer interrupt handler 140 by the processor core 101, as long as there is implementation of the function of determining whether or not the sensor data obtained by the data obtaining unit 141 satisfies the condition for shortening the sampling interval, it serves the purpose.

If the obtained sensor data satisfies the condition for shortening the sampling interval (Yes at Step S2), then the data storage controller 142 confirms whether or not the sensor data obtained at Step S1 can be stored in the embedded SRAM 102 (Step S3). Herein, confirming whether or not the sensor data obtained at Step S1 can be stored in the embedded SRAM 102 points to the following operation. If the volume of data already written in the SRAM 102 has reached the data capacity of the SRAM 102 so that no additional data can be written, then it is determined that the obtained sensor data cannot be stored. However, if there is sufficient data capacity in the SRAM 102, then it is determined that the obtained sensor data can be stored. If the sensor data can be stored in the SRAM 102 (Yes at Step S3), then the data storage controller 142 performs control so that the sensor data at Step S1 is stored in the SRAM 102 (Step S4).

On the other hand, if the sensor data cannot be stored in the SRAM 102 (No at Step S3), then the data storage controller 142 performs control so that the sensor data obtained at Step S1 and the sensor data stored at that point of time in the SRAM 102 is stored in the nonvolatile memory 500 (Step S5). Then, the data storage controller 142 deletes all sensor data from the SRAM 102 (Step S6).

Subsequent to the operation performed at Step S4 or Step S6, the power saving mode setting unit 143 performs control to set the power saving mode to a level at which the data (including the sensor data) stored in the SRAM 102 is not lost (Step S7). Then, the timer setting unit 120 sets the time for the timer 105 to generate an interrupt for shortening the sampling interval (Step S8). Herein, setting the sampling interval to be short implies setting the sampling interval to be shorter than the sampling interval set at Step S13. Subsequently, the processor core 101 executes a WFI instruction for the purpose of switching to the power saving mode set at Step S7, and switches to that power saving mode (Step S9).

Meanwhile, if the obtained sensor data does not satisfy the condition for shortening the sampling interval (No at Step S2), then the data storage controller 142 performs control so that the sensor data obtained by the data obtaining unit 141 and the sensor data stored at that point of time in the SRAM 102 is clubbed together and stored in the nonvolatile memory 500 (Step S10). Meanwhile, if there is no sensor data stored in the SRAM 102, then the data storage controller 142 performs control so that only the sensor data obtained at Step S1 is stored in the nonvolatile memory 500.

Then, the data storage controller 142 deletes all sensor data from the SRAM 102 (Step S11). Subsequently, the power saving mode setting unit 143 performs control to set the power saving mode for lower power consumption, such as the power saving mode in which data cannot be held in the SRAM 102 (Step S12). Then, the timer setting unit 120 sets the time for the timer 105 to generate an interrupt for prolonging the sampling interval (Step S13). Herein, setting the sampling interval to be long implies setting the sampling interval to be longer than the sampling interval set at Step S8. Thus, it can be said that the timer setting unit 120 sets the sampling interval according to the sensor data obtained by the data obtaining unit 141. Subsequently, the processor core 101 executes a WFI instruction for the purpose of switching to the power saving mode set at Step S12, and switches to that power saving mode (Step S14). In this example, when the sampling interval, which indicates the interval at which the data obtaining unit 141 obtains the sensor data, is equal to or smaller than the threshold value; the subsequent power saving mode can be treated as a first power saving mode in which data can be held in the SRAM 102. On the other hand, if the sampling interval exceeds the threshold value, then the subsequent power saving mode can be treated as a second power saving mode in which data cannot be held in the SRAM 102. Thus, when the subsequent power saving mode points to the first power saving mode, it can be said that the data storage controller 142 performs control so that the sensor data obtained by the data obtaining unit 141 is stored in the SRAM 102. On the other hand, when the subsequent power saving mode points to the second power saving mode, it can be said that the data storage controller 142 performs control so that the sensor data obtained by the data obtaining unit 141 and the sensor data stored in the SRAM 102 is stored in the nonvolatile flash memory 103.

Figure 5:
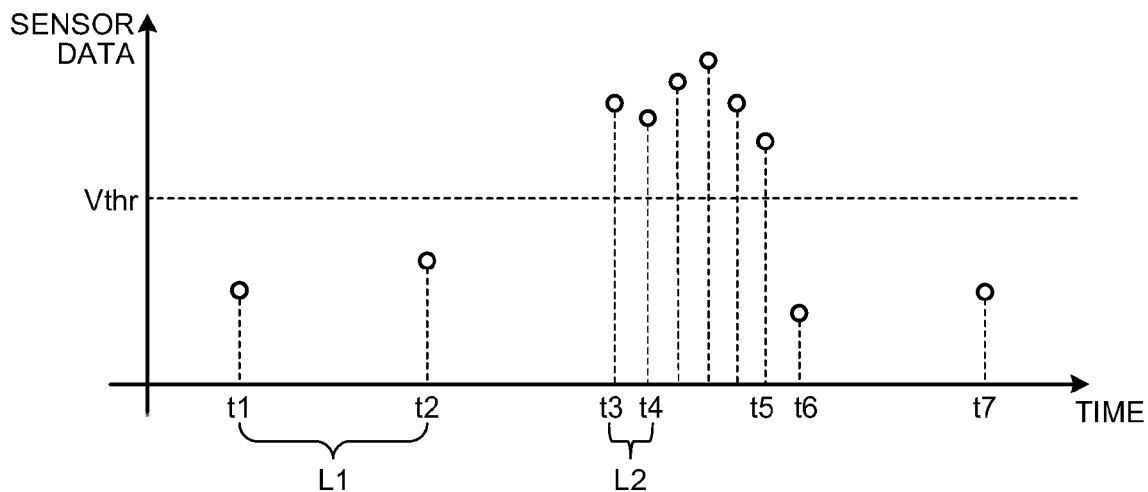
FIG. 5 is a diagram for explaining a specific example of the first embodiment.

The flow of the abovementioned operations is explained with reference to an actual example illustrated in FIG. 5. In the example illustrated in FIG. 5, the horizontal axis represents times and the vertical axis represents values of the sensor data. As illustrated in FIG. 5, at a time t1, the data obtaining unit 141 obtains sensor data. In the example illustrated in FIG. 5, when the value of the obtained sensor data is greater than a threshold value Vthr, it is assumed that the sensor data satisfies the condition for shortening the sampling interval. In this example, L1 represents the time length of the sampling interval in the case in which the sampling interval is prolonged; while L2 represents the time length of the sampling interval in the case in which the sampling interval is shortened.

Since the sensor data obtained at the time t1 is smaller than the threshold value Vthr and does not satisfy the condition for shortening the sampling interval, the data storage controller 142 performs control so that the data obtained at the time t1 is stored in the nonvolatile memory 500. Then, the power saving mode setting unit 143 performs control to set a power saving mode for lower power consumption, such as the power saving mode in which data cannot be held in the SRAM 102. Subsequently, the timer setting unit 120 sets a time t2, which is reached after the elapse of the time length L1 from the time t1, as the time for the timer 105 to generate the next interrupt. Then, the processor core 101 executes a WFI instruction for the purpose of switching to the power saving mode set by the power saving mode setting unit 143, and switches to that power saving mode.

At the time t2, when the timer 105 generates an interrupt, the microcomputer 100 returns from the power saving mode. Then, the processor core 101 starts executing the timer interrupt handler 140, and the data obtaining unit 141 obtains the sensor data. In the example illustrated in FIG. 5, since the sensor data obtained at the time t2 is also smaller than the threshold value Vthr and does not satisfy the condition for shortening the sampling interval, an identical operation is performed to the operation performed at the time t1.

At a time t3 that is reached after the elapse of the time length L1 from the time t2, the timer 105 again generates an interrupt and the microcomputer 100 returns from the power saving mode. Then, the processor core 101 starts executing the timer interrupt handler 140, and the data obtaining unit 141 obtains the sensor data. In the example illustrated in FIG. 5, since the sensor data obtained at the time t3 is greater than the threshold value Vthr, it satisfies the condition for shortening the sampling interval. Therefore, the data storage controller 142 performs control so that the data obtained at the time t3 is stored in the SRAM 102. Then, the power saving mode setting unit 143 performs control to set the power saving mode to a level at which the data stored in the SRAM 102 is not lost. The timer setting unit 120 sets a time t4, which is reached after the elapse of the time length L2 from the time t3, as the time for the timer 105 to generate the next interrupt. Subsequently, the processor core 101 executes a WFI instruction for the purpose of switching to the power saving mode set by the power saving mode setting unit 143, and switches to that power saving mode.

In the example illustrated in FIG. 5, the sensor data up to a time t5 exceeds the threshold value Vthr. Therefore, the same operations are repeated up to the time t5. At a time t6, when the timer 105 generates an interrupt, the microcomputer 100 returns from the power saving mode. Then, the processor core 101 starts executing the timer interrupt handler 140, and the data obtaining unit 141 obtains the sensor data. In the example illustrated in FIG. 5, the sensor data obtained at the time t6 is smaller than the threshold value Vthr and does not satisfy the condition for shortening the sampling interval. Hence, the data storage controller 142 performs control so that the sensor data stored in the SRAM 102 (i.e., the sensor data obtained from the time t3 till the time t6) and the sensor data obtained at the time t6 is clubbed together and stored (written) in the nonvolatile memory 500. Then, the power saving mode setting unit 143 performs control to set a power saving mode for lower power consumption, such as the power saving mode in which data cannot be held in the SRAM 102. Subsequently, the timer setting unit 120 sets a time t7, which is reached after the elapse of the time length L1 from the time t6, as the time for the timer 105 to generate the next interrupt. Then, the processor core 101 executes a WFI instruction for the purpose of switching to the power saving mode set by the power saving mode setting unit 143, and switches to that power saving mode.

As described above, in the first embodiment, if the sampling interval, which indicates the interval at which the sensor data is obtained, is equal to or smaller than a threshold value (i.e., if the sensor data satisfies the condition for shortening the sampling interval), then control is performed so that the sensor data obtained by the data obtaining unit 141 is stored in the SRAM 102. On the other hand, if the sampling interval exceeds the threshold value (i.e., if the sensor data does not satisfy the condition for shortening the sampling interval), then control is performed so that the sensor data obtained by the data obtaining unit 141 and the sensor data stored at that point of time in the SRAM 102 is clubbed together and stored in the nonvolatile memory 500. With that, when the sampling interval is short, it becomes possible to prevent frequent writing at a small granularity in the nonvolatile memory 500. Moreover, when the sampling interval goes on increasing, the sensor data can be clubbed together and written in the nonvolatile memory 500, and the microcomputer 100 can be switched to the power saving mode for lower power consumption, such as the power saving mode in which data cannot be held in the SRAM 102. That enables achieving an advantageous effect of enhancement in the power efficiency.

Second Embodiment

Given below is the explanation of a second embodiment. In the second embodiment, the output of the sensor devices 400 is measured using the comparator 110 of the microcomputer 100, and the sensor data is obtained by an operation performed in response to an interrupt generated by the comparator 110 (i.e., by an operation performed by a handler of comparator interrupts). The comparator 110 is one of the devices embedded in the microcomputer 100, and can generate an interrupt when an analog signal (a voltage signal corresponding to the physical data measured by the sensor devices 400) exceeds or falls below a voltage set in advance. In the first embodiment, the microcomputer 100 proactively obtains the sensor data in response to a timer interrupt. In contrast, in the second embodiment, the sensor devices 400 make use of the comparator 110 of the microcomputer 100 so as to make the microcomputer 100 return from the power saving mode to read the sensor data. Thus, data reading is triggered by the sensor devices 400. Explained below are the details of the second embodiment. Regarding the portion that is identical to the first embodiment, the explanation is not repeated.

Figure 6:
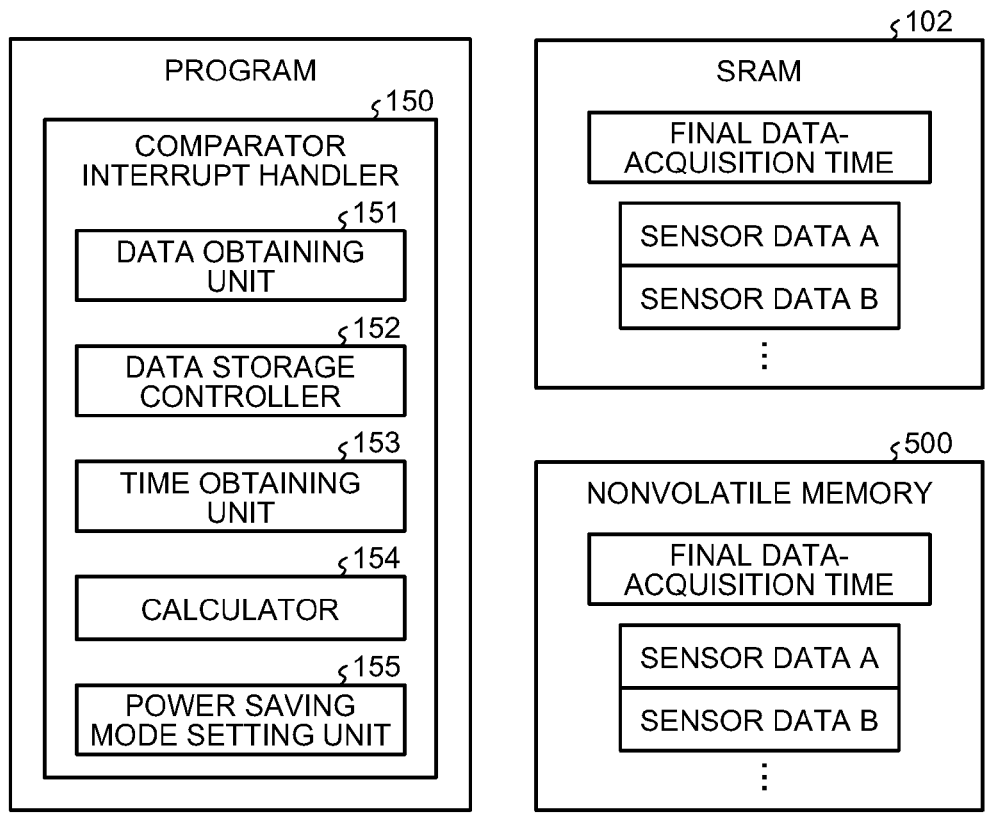
FIG. 6 is a schematic diagram illustrating a configuration example of a program according to a second embodiment.

FIG. 6 is a schematic diagram illustrating a configuration example of the program executed by the processor core 101 according to the second embodiment. The program includes a comparator interrupt handler 150 that instructs an operation to be performed in response to the reception of an interrupt signal from the comparator 110 (i.e., in response to an interrupt generated by the comparator 110). When the processor core 101 executes the comparator interrupt handler 150, the functions of a data obtaining unit 151, a data storage controller 152, a time obtaining unit 153, a calculator 154, and a power saving mode setting unit 155 are executed.

The data obtaining unit 151, the data storage controller 152, and the power saving mode setting unit 155 have identical functions to the functions described in the first embodiment. Hence, the detailed explanation of those functions is not repeated. The time obtaining unit 153 obtains the time (the current time) in response to every instance of obtaining the sensor data by the data obtaining unit 151, and writes the obtained time in the SRAM 102 or the nonvolatile memory 500. In this example, the time stored in the SRAM 102 or the nonvolatile memory 500 is updated every time the time obtaining unit 153 writes the time. In the following explanation, the latest time stored in the SRAM 102 or the nonvolatile memory 500 is sometimes called "final data-acquisition time".

The calculator 154 calculates the sampling interval from the difference between the latest time obtained by the time obtaining unit 153 and the previous time. In the second embodiment, every time the time obtaining unit 153 obtains the time, the calculator 154 can calculate the sampling interval from the difference between the obtained time (i.e., the latest time) and the final data-acquisition time stored at that point of time in the SRAM 102 or the nonvolatile memory 500 (i.e., the final data-acquisition time written previous to the obtained time).

Figure 7:
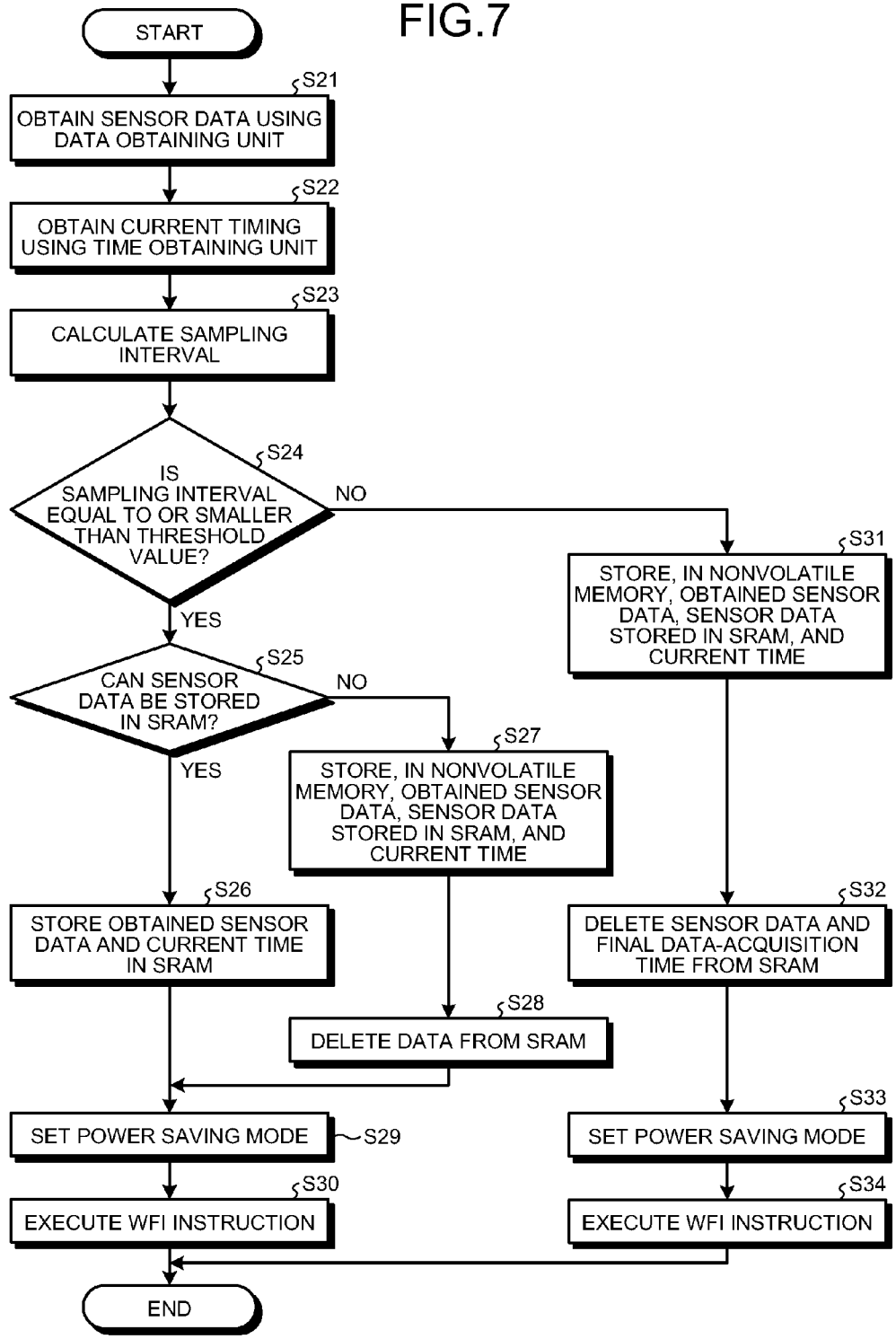
FIG. 7 is a flowchart for explaining an example of operations performed according to the program according to the second embodiment.

Explained below with reference to FIG. 7 is the explanation of an example of operations performed according to the program mentioned above. FIG. 7 is a flowchart for explaining an example of operations performed according to the program mentioned above. When the comparator 110 detects sensor data equal to or greater than a threshold value and generates an interrupt, the microcomputer 100 returns from the power saving mode and the processor core 101 starts executing the comparator interrupt handler 150. Firstly, as illustrated in FIG. 7, the data obtaining unit 151 obtains the sensor data (Step S21). Herein, the value detected by the comparator 110 can be used as the sensor data, or the data obtained by conversion by the A/D converter 109 can be used as the sensor data, or the data obtained via the serial bus controller 106 can be used as the sensor data. Then, the time obtaining unit 153 obtains the current time (that can be considered as the time at which the data obtaining unit 151 obtained the sensor data) (Step S22).

Subsequently, the calculator 154 calculates the sampling interval from the difference between the current time obtained at Step S22 and the final data-acquisition time (Step S23). If the final data-acquisition time is stored in the SRAM 102, then the difference between the current time obtained at Step S22 and the final data-acquisition time stored in the SRAM 102 is obtained as the sampling interval. Similarly, if the final data-acquisition time is stored in the nonvolatile memory 500, then the difference between the current time obtained at Step S22 and the final data-acquisition time stored in the SRAM 102 is obtained as the sampling interval. However, at the first time of obtaining data at which the final data-acquisition time is neither stored in the SRAM 102 nor stored in the nonvolatile memory 500, the difference (the sampling interval) is treated to be equal to zero.

Then, the data storage controller 152 confirms whether or not the sampling interval calculated at Step S23 is equal to or smaller than a threshold value (Step S24). If the sampling interval is equal to or smaller than the threshold value (Yes at Step S24), then the data storage controller 152 confirms whether or not the sensor data obtained at Step S21 and the current time obtained at Step S22 can be stored in the embedded SRAM 102 (Step S25). If the data can be stored in the SRAM 102 (Yes at Step S25), then the data storage controller 152 performs control so that the sensor data obtained at Step S21 is stored in the SRAM 102 and the current time obtained at Step S22 is stored as the final data-acquisition time in the SRAM 102 (Step S26).

On the other hand, if the data cannot be stored in the SRAM 102 (No at Step S25), then the data storage controller 152 performs control so that the sensor data obtained at Step S21 and the sensor data stored at that point of time in the SRAM 102 is stored in the nonvolatile memory 500 and the current time obtained at Step S22 is stored as the final data-acquisition time in the nonvolatile memory 500 (Step S27). Then, the data storage controller 152 deletes data (the sensor data and the final data-acquisition time) from the SRAM 102 (Step S28).

Subsequent to the operation performed at Step S26 or Step S28, the power saving mode setting unit 155 performs control to set the power saving mode to a level at which the data stored in the SRAM 102 is not lost (Step S29). Subsequently, the processor core 101 executes a WFI instruction for the purpose of switching to the power saving mode set at Step S29, and switches to that power saving mode (Step S30).

Meanwhile, if the sampling interval exceeds the threshold value (No at Step S24), then the data storage controller 152 performs control so that the sensor data obtained at Step S21 and the sensor data stored at that point of time in the SRAM 102 is clubbed together and stored in the nonvolatile memory 500 and the current time obtained at Step S22 is stored as the final data-acquisition time in the nonvolatile memory 500 (Step S31). Then, the data storage controller 152 deletes the data from the SRAM 102 (Step S32). Subsequently, the power saving mode setting unit 155 performs control to set the power saving mode for lower power consumption, such as the power saving mode in which data cannot be held in the SRAM 102 (Step S33). Then, the processor core 101 executes a WFI instruction for the purpose of switching to the power saving mode set at Step S33, and switches to that power saving mode (Step S34).

Figure 8:
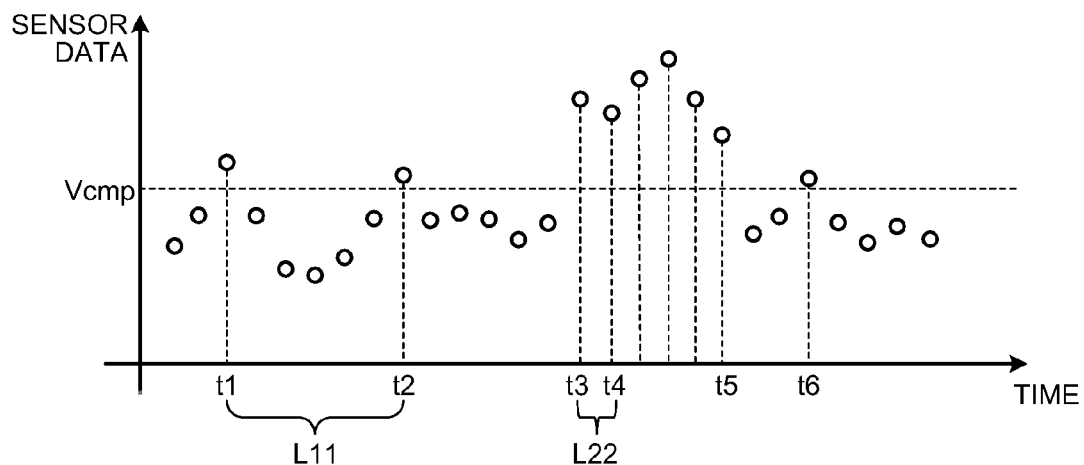
FIG. 8 is a diagram for explaining a specific example of the second embodiment.

The flow of the abovementioned operations is explained with reference to an actual example illustrated in FIG. 8. In the example illustrated in FIG. 8, the horizontal axis represents times and the vertical axis represents values of the sensor data (in this example, the analog voltage signals input to the comparator 110). In the example illustrated in FIG. 8, the comparator 110 obtains the sensor data from the sensor devices 400 at an arbitrary timing and generates an interrupt if the value of the obtained sensor data is greater than a threshold value Vcmp. In the example illustrated in FIG. 8, at the time t1, the sensor data input to the comparator 110 is greater than the threshold value Vcmp, and the comparator 110 generates an interrupt. In response, the microcomputer 100 returns from the power saving mode. Then, the processor core 101 starts executing the comparator interrupt handler 150; the data obtaining unit 151 obtains the sensor data at the time t1; and the time obtaining unit 153 obtains the current time t1.

Subsequently, the calculator 154 obtains the difference between the current time obtained by the time obtaining unit 153 and the final data-acquisition time. However, in the initial state, the final data-acquisition time is neither stored in the SRAM 102 nor stored in the nonvolatile memory 500. Hence, the difference (the sampling interval) is treated to be equal to zero. In this case, the sampling interval is equal to or smaller than the threshold value. Hence, the data storage controller 152 checks whether the SRAM 102 has sufficient capacity to store data. Since there is sufficient capacity, the data storage controller 152 performs control so that the sensor data obtained at the time t1 is stored in the SRAM 102 and the current time t1 is stored as the final data-acquisition time in the SRAM 102. Then, the power saving mode setting unit 155 performs control to set the power saving mode to a level at which the data stored in the SRAM 102 is not lost. Subsequently, the processor core 101 executes a WFI instruction for the purpose of switching to the power saving mode set by the power saving mode setting unit 155, and switches to that power saving mode.

At the time t2, the sensor data having the value greater than the threshold value Vcmp is input to the comparator 110, and the comparator 110 generates an interrupt. In response, the microcomputer 100 returns from the power saving mode. Then, the processor core 101 starts executing the comparator interrupt handler 150; the data obtaining unit 151 obtains the sensor data at the time t2; and the time obtaining unit 153 obtains the current time t2. Subsequently, the calculator 154 obtains, as the sampling interval, the difference (L11) between the current time t2 obtained by the time obtaining unit 153 and the final data-acquisition time t1. Herein, Lthr represents a threshold value used in determining whether the sampling interval is long or short; and it is assumed that the different L11 is longer than the threshold value Lthr. Thus, the data storage controller 152 can determine that the sampling interval is long (exceeding the threshold value). In this case, the data storage controller 152 performs control so that the sensor data stored in the SRAM 102 (i.e., the sensor data obtained at the time t1) and the sensor data obtained at the time t2 is clubbed together and stored in the nonvolatile memory 500 and the current time t2 is stored as the final data-acquisition time in the nonvolatile memory 500. Then, the data storage controller 152 deletes the data from the SRAM 102.

Subsequently, the power saving mode setting unit 155 performs control to set the power saving mode for lower power consumption, such as the power saving mode in which data cannot be held in the SRAM 102. Then, the processor core 101 executes a WFI instruction for the purpose of switching to the power saving mode set by the power saving mode setting unit 155, and switches to that power saving mode. In the example illustrated in FIG. 8, at the time t3, the operations performed at the time t2 are performed in an identical manner.

Then, at the time t4, the sensor data having the value greater than the threshold value Vcmp is input to the comparator 110, and the comparator 110 generates an interrupt. In response, the microcomputer 100 returns from the power saving mode. Subsequently, the processor core 101 starts executing the comparator interrupt handler 150; the data obtaining unit 151 obtains the sensor data at the time t4; and the time obtaining unit 153 obtains the current time t4. Then, the calculator 154 obtains, as the sampling interval, the difference (L22) between the current time t4 and the final data-acquisition time t3. Herein, it is assumed that the difference L22 is equal to or smaller than the threshold value Lthr. Thus, the data storage controller 152 can determine that the sampling interval is short (equal to or smaller than the threshold value). In this case, since the sampling interval is short and the SRAM 102 has sufficient capacity, the data storage controller 152 performs control so that the sensor data obtained at the time t4 is stored in the SRAM 102 and the time t4 is stored as the final data-acquisition time in the SRAM 102. Then, the power saving mode setting unit 155 performs control to set the power saving mode to a level at which the data stored in the SRAM 102 is not lost. Subsequently, the processor core 101 executes a WFI instruction for the purpose of switching to the power saving mode set by the power saving mode setting unit 155, and switches to that power saving mode. In the example illustrated in FIG. 8, till the time t5, the operations performed at the time t4 are performed in an identical manner (that is, till the time t5, the sampling interval is equal to or greater than the threshold value Lthr).

Then, at the time t6, the sensor data having the value greater than the threshold value Vcmp is input to the comparator 110, and the comparator 110 generates an interrupt. In response, the microcomputer 100 returns from the power saving mode. Subsequently, the processor core 101 starts executing the comparator interrupt handler 150; the data obtaining unit 151 obtains the sensor data at the time t6; and the time obtaining unit 153 obtains the current time t6. Then, the calculator 154 obtains, as the sampling interval, the difference between the current time t6 and the final data-acquisition time t5. Herein, it is assumed that the difference is greater than the threshold value Lthr. Thus, the data storage controller 152 can determine that the sampling interval is long (exceeding the threshold value). In this case, the data storage controller 152 performs control so that the sensor data stored in the SRAM 102 and the sensor data obtained at the time t6 is clubbed together and stored in the nonvolatile memory 500 and the time t6 is stored as the final data-acquisition time in the nonvolatile memory 500. Then, the data storage controller 152 deletes the data in the SRAM 102. Subsequently, the power saving mode setting unit 155 performs control to set the power saving mode for lower power consumption, such as the power saving mode in which data cannot be held in the SRAM 102. Then, the processor core 101 executes a WFI instruction for the purpose of switching to the power saving mode set by the power saving mode setting unit 155, and switches to that power saving mode.

In the second embodiment, the sensor devices 400 that detect whether or not the data input to the comparator 110 exceeds the threshold value are same as the sensor devices 400 that obtain the sensor data. However, it is also possible to use different sensor devices 400 for the two different tasks. For example, consider a case in which a value (equivalent to sensor data) measured by an acceleration sensor is to be obtained (read) only if a value measured by a humidity sensor is equal to or greater than the threshold value. In that case, the comparator 110 can be used to detect the case in which a value measured by the humidity sensor is equal to or greater than the threshold value, and the value of the acceleration sensor can be obtained in response to an interrupt operation performed by the comparator 110.

In the second embodiment too, if the sampling interval is equal to or smaller than a threshold value, then control is performed so that the sensor data obtained by the data obtaining unit 151 is stored in the SRAM 102. On the other hand, if the sampling interval exceeds the threshold value, then control is performed so that the sensor data obtained by the data obtaining unit 151 and the sensor data stored at that point of time in the SRAM 102 is clubbed together and stored in the nonvolatile memory 500. Hence, in an identical manner to the first embodiment, it becomes possible to achieve an advantageous effect of enhancement in the power efficiency.

Moreover, in the second embodiment, the microcomputer 100 is switched back from the power saving mode using the comparator 110. However, that is not the only possible case, and it is possible to use methods other than using the comparator 110. For example, among sensor devices that are capable of transferring the sensor data using I2C, SPI, or GPIO; there are some sensor devices that, when the measured sensor data exceeds or falls below the threshold value, switch back the microcomputer 100 from the power saving mode using an I2C interrupt, an SPI interrupt, or a GPIO interrupt. In that case, the return from the power saving mode is achieved not using the comparator 110 but using I2C, SPI, or GPIO. However, in that case, the microcomputer 100 needs to be configured to return from the power saving mode in response to an I2C response, a DPI interrupt, or a GPIO interrupt.

Third Embodiment

Given below is the explanation of a third embodiment. In the third embodiment, an instruction for changing the sampling interval is received, and the sampling interval is set according to the received instruction. Explained below are the details of the third embodiment. Regarding the portion that is identical to the first embodiment, the explanation is not repeated.

Figure 9:
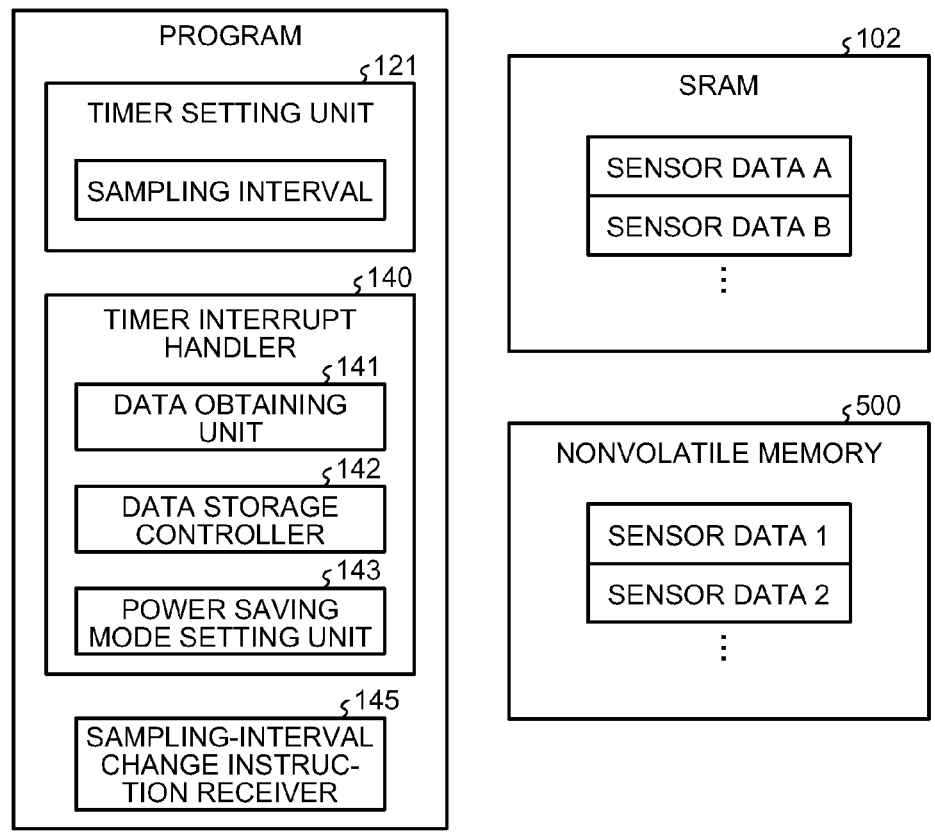
FIG. 9 is a schematic diagram illustrating a configuration example of a program according to a third embodiment.

FIG. 9 is a schematic diagram illustrating a configuration example of the program executed by the processor core 101 according to the third embodiment. As compared to the program according to the first embodiment (FIG. 3), the program according to the third embodiment differs in the way that a sampling-interval change instruction receiver 145, which receives an instruction for changing the sampling interval (in the following explanation, sometimes called a "sampling interval change instruction") is included, and that a timer setting unit 121 has an additional function of setting the sampling interval according to the sampling interval change instruction received by the sampling-interval change instruction receiver 145. In this example, the sampling-interval change instruction receiver 145 may be referred to as a "receiver", and the timer setting unit 121 may be referred to as a "setting unit".

Figure 10A:
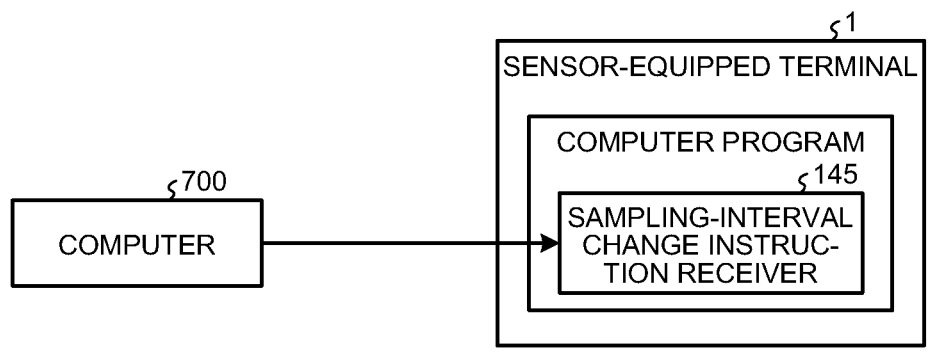
FIGS. 10A to 10C are diagrams illustrating the ways in which a sampling interval change instruction is received according to the third embodiment.

For example, as illustrated in FIG. 10A, it is possible that the sampling interval change instruction is transmitted from a separate computer 700 via a network. In that case, for example, it is also possible that a different sensor-equipped terminal on a sensor network transmits a sampling interval change instruction to the sensor-equipped terminal 1 according to the third embodiment. For example, it is possible to think of the following case. A plurality of sensor-equipped terminals constitutes a network. Then, in tune with the shortening of the sampling interval in one of the sensor-equipped terminals, an instruction is transmitted for shortening the sampling interval of the neighboring sensor-equipped terminals. This operation is repeatedly performed so that the instruction for shortening the sampling interval gradually propagates to all sensor-equipped terminals in the sensor network. Alternatively, it is possible to think of a case in which the sampling interval change instructions are transmitted to sensor-equipped terminals from a control server computer. At that time, the control server computer can transmit the sampling interval change instructions at the same time. Alternatively, for example, the configuration can be such that the control server computer transmits the sampling interval change instructions to some of the sensor-equipped terminals, and the sensor-equipped terminals which have already received the sampling interval change instructions can forward them to the remaining sensor-equipped terminals.

Figure 10B:
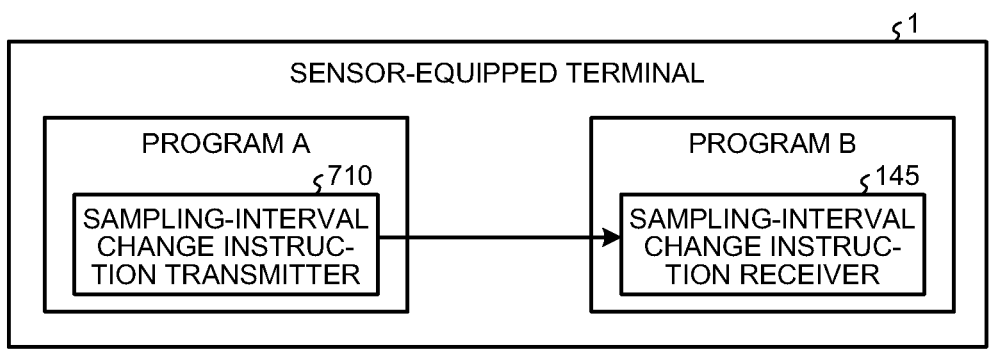

Meanwhile, for example, as illustrated in FIG. 10B, it is possible to think that a sampling interval change instruction is transmitted by a sampling-interval change instruction transmitter 710 of a different program installed in the sensor-equipped terminal 1 (i.e., a different program than the program including the sampling-interval change instruction receiver 145). For example, a program A monitors a humidity sensor. When the value measured by the humidity sensor is equal to or greater than a threshold value, the sampling-interval change instruction transmitter 710 of the program A transmits a sampling interval change instruction to a program B (that includes the sampling-interval change instruction receiver 145). Accordingly, the program B can set (for example, can shorten) the sampling interval for obtaining the sensor data from an acceleration server.

Figure 10C:
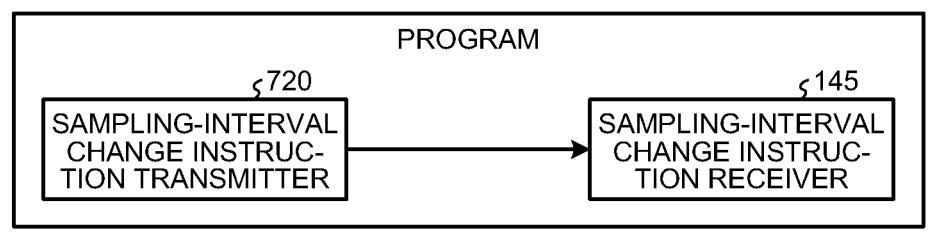

For example, as illustrated in FIG. 10C, it is possible to think that a sampling interval change instruction is transmitted by a sampling-interval change instruction transmitter 720 of the program that also includes the sampling-interval change instruction receiver 145. Meanwhile, a sampling interval change instruction may either have the value of the sampling interval written therein or have an ID representing the value of the sampling interval written therein. In the case in which the ID is written, the timer setting unit 121 or the sampling-interval change instruction receiver 145 are configured to hold a table of correspondence relationship between the value of the sampling interval and the ID.

Figure 11:
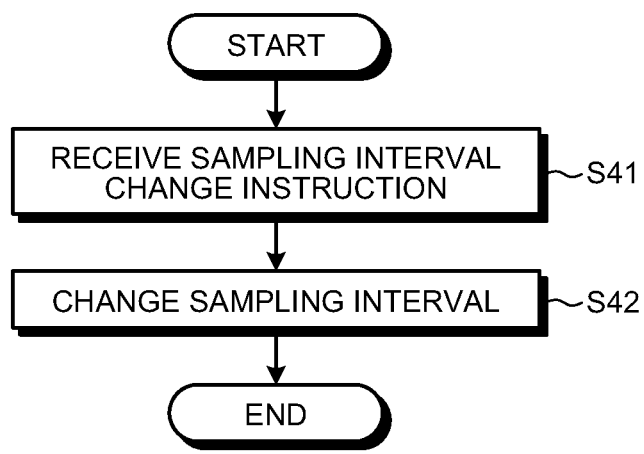
FIG. 11 is a flowchart for explaining an example of operations performed according to the program according to the third embodiment.

FIG. 11 is a flowchart for explaining an example of the operations performed in response to receiving a sampling interval change instruction. When the sampling-interval change instruction receiver 145 receives a sampling interval change instruction (Step S41), the timer setting unit 121 sets the sampling interval (i.e., changes the value of the sampling interval managed therein) according to the received sampling interval change instruction (Step S42). For example, if the sampling interval change instruction has the value of the sampling interval written therein, then the timer setting unit 121 sets that value. Alternatively, for example, if the sampling interval change instruction has the ID of the sampling interval written therein, then the timer setting unit 121 refers to the table, obtains the value of the sampling interval corresponding to the ID, and sets the obtained value. Herein, the value of the sampling interval is stored in, for example, a register (not illustrated).

Figure 12:
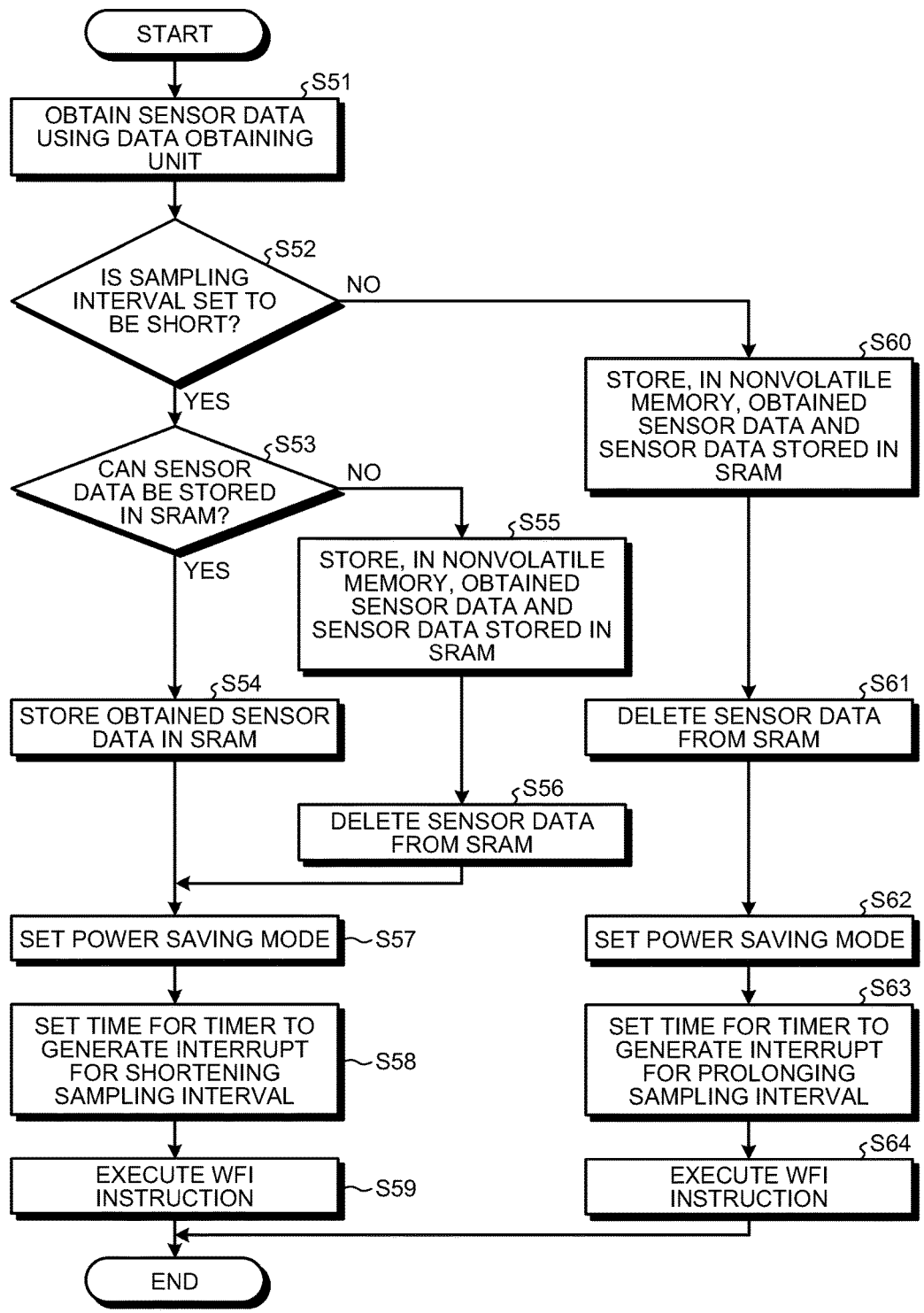
FIG. 12 is a flowchart for explaining an example of operations performed according to the program according to the third embodiment.

FIG. 12 is a flowchart for explaining an example of operations performed in response to an interrupt generated by the timer 105. Herein, the flow of operations is basically identical to the flow of operations illustrated in FIG. 4. Firstly, the data obtaining unit 141 obtains the sensor data (Step S51). Then, the data obtaining unit 141 confirms whether or not the sampling interval is set to be short (Step S52). For example, the data obtaining unit 141 refers to the register in which the value representing the sampling interval as set by the timer setting unit 121 is stored. If the value stored in the register is equal to or smaller than the threshold value, then the data obtaining unit 141 can determine that the sampling interval is set to be short.

If the sampling interval is set to be short (Yes at Step S52), that is, if the sampling interval is equal to or smaller than the threshold value; then the operations from Step S53 to Step S57 are performed. Herein, the operations from Step S53 to Step S57 are identical to the operations from Step S3 to Step S7 illustrated in FIG. 4. Subsequent to the operation performed at Step S57, the timer setting unit 121 sets the time for the timer 105 to generate an interrupt for shortening the sampling interval (Step S58). Subsequently, the processor core 101 executes a WFI instruction for the purpose of switching to the power saving mode set at Step S57, and switches to that power saving mode (Step S59).

Meanwhile, if the sampling interval is not set to be short (No at Step S52), that is, if the sampling interval exceeds the threshold value; then the operations from Step S60 to Step S62 are performed. Herein, the operations from Step S60 to Step S62 are identical to the operations from Step S10 to Step S12 illustrated in FIG. 4. Subsequent to the operation performed at Step S62, the timer setting unit 121 sets the time for the timer 105 to generate an interrupt for prolonging the sampling interval (Step S63). Subsequently, the processor core 101 executes a WFI instruction for the purpose of switching to the power saving mode set at Step S63, and switches to that power saving mode (Step S64).

In the third embodiment too, if the sampling interval is equal to or smaller than a threshold value, then control is performed so that the sensor data obtained by the data obtaining unit 141 is stored in the SRAM 102. On the other hand, if the sampling interval exceeds the threshold value, then control is performed so that the sensor data obtained by the data obtaining unit 141 and the sensor data stored at that point of time in the SRAM 102 is clubbed together and stored in the nonvolatile memory 500. Hence, in an identical manner to the first embodiment, it becomes possible to achieve an advantageous effect of enhancement in the power efficiency.

Given below is the explanation of exemplary situations in which the embodiments of the invention are used and exemplary effects of the embodiments. Conventionally, a sensor-equipped terminal (also called a sensor node) is known that is a computer for processing data about temperature, humidity, or acceleration measured by sensors. Examples of the usage of a sensor-equipped terminal include a configuration in which data is obtained individually in the sensor-equipped terminal and is displayed for use on a display installed in the sensor-equipped terminal; a configuration in which the data is uploaded for use by the sensor-equipped terminal to a personal computer (PC) or a server; and a configuration in which data is obtained by a plurality of sensor-equipped terminals in a coordinated manner and is uploaded for use from the end node or a relay server to a central PC or a server. A sensor-equipped terminal includes a sensor corresponding to the type of data to be obtained, and it is often the case that a single-equipped terminal includes a plurality of sensors.

The sensor-equipped terminals are used in various fields. For example, in the field of healthcare, there are various types of sensor-equipped terminals such as wristwatch-type sensor-equipped terminals, patch-type sensor-equipped terminals to be put on the skin, and pochette-type sensor-equipped terminals to be worn on the waist. Such sensor-equipped terminals are used in obtaining data that is responsible in obtaining, for example, the pulse, the body temperature, the number of steps, the posture, or the number of roll overs.

In the field of infrastructure, sensor-equipped terminals are used in obtaining a variety of data such as the data for assessment of structural objects such as roads, bridges, or tunnels, or the data about the vibrations or the temperature at locations such as cliffs, forests, or rivers at which natural calamities may occur. For example, there are times when, in order to obtain vibration information or temperature information, sensor-equipped terminals are installed at key locations of a structural object so as to obtain data related to the vibrations or the temperature of the structural object and accordingly calculate the aged deterioration or the time of maintenance and repair of the structural object. Alternatively, there are times when gradient data of cliffs or forests is used in calculating the evidence or predictor of a collapse. Similarly, data on the water volume of a river is used in estimating the attainment to a dangerous water level.

For example, a sensor-equipped terminal aimed at healthcare is put on a human body and used. Hence, it essentially runs on a battery. In order to reduce the discomfort while wearing a sensor-equipped terminal, it is desirable that the battery is small in size. Moreover, in order to alleviate the burden of charging the battery, it is desirable to have a long machine time with a single charging. Hence, power saving capability is of enormous significance.

The sensor-equipped terminals aimed at infrastructure equipment are installed at a number of installation sites and at locations where it is not common for people to enter. Hence, such sensor-equipped terminals also often run on a battery in order to reduce the installation cost or the post-installation maintenance cost. Moreover, in order to reduce the number of times of replacing the battery or to reduce the number of times of charging the battery, there is a strong demand to have power saving capability.

Among the sensor-equipped terminals, some obtain data on a constant basis and some obtain data at a certain sampling interval. Herein, the sampling interval may be a fixed interval or may often change depending on the situation. The invention is related to the sampling interval that changes depending on the situation.

For example, in a sensor-equipped terminal aimed at healthcare, in the case of obtaining data related to the movements of a person such as the number of steps or the postures taken by the person; when the person is moving in a major way, the sampling interval is shortened and minute measurement is done in a detailed manner. In contrast, when the person is not moving much such as during sleep, even if the sampling interval is prolonged and measurement is done in a rough manner, the desired data can be adequately obtained. In the case of obtaining the data related to the body temperature too, since the body temperature does not change much during sleep, the sampling interval is prolonged. In contrast, while the person is awake, the sampling interval is shortened. In this way, depending on the desired type of data and the situation, the sampling interval is changed so as to reduce unnecessary data acquisition. That enables achieving reduction in the power consumption and the data size.

In the case of using a sensor-equipped terminal aimed at infrastructure equipment and used in measuring the vibrations of a structural object; since feeble vibrations are unlikely to have a significant impact on the structural object, the vibrations equal to or smaller than a threshold value are set to have a longer sampling interval. However, since the vibrations exceeding the threshold value have a significant impact, the sampling interval can be shortened with the aim of performing detailed analysis. Alternatively, in the case of focusing on the impact of vibrations of a bridge or a road caused due to the passing vehicles, separate sensors other than the sensor-equipped terminals are installed to detect the passing of vehicles. While the vehicles are passing, the sampling interval is shortened and detailed analysis is performed. On the other hand, when no vehicles are passing, the sampling interval is prolonged so that the calculation load can be reduced.

Meanwhile, there are also times when a plurality of sensor-equipped terminals constitutes a network, and the sampling interval is changed according to a signal from a neighboring node.

In this way, the sampling interval, which indicates the interval at which data is obtained by a sensor-equipped terminal, is sometimes relatively longer and sometimes relatively shorter; and the technology of changing the sampling interval depending on the situation is already known.

Such sensor-equipped terminals often run on a battery, and the measured data is often stored in a nonvolatile memory so as to prevent it from being lost even if the electrical power stored in the battery is exhausted. However, if, every time the data is obtained from the sensor, that data is stored in a nonvolatile memory; then there occur a lot of instances where writing performed at a small granularity.

In that regard, in various types of the nonvolatile memory such as a NAND flash memory, a NOR flash memory, a FeRAM, an ReRAM, an MRAM, and a PCM; instead of performing frequent writing of data at a small granularity, if the data is clubbed into large-size data and written so as to reduce the number of times of writing, there occurs an enhancement in the power efficiency at around the unit writing size.

However, in the conventional technology, even if the sampling interval is short, writing of data at a small granularity occurs on a frequent basis with respect to a nonvolatile memory, thereby resulting in a decline in the power efficiency. In that regard, if the embodiments of the invention are implemented, it becomes possible to enhance the power efficiency.

In the embodiments described above, the microcomputer 100 may be referred to as an "information processing device". Alternatively, the sensor-equipped terminal 1 may be also referred to as the "information processing device".

Moreover, the microcomputer 100, which is configured with a single-chip IC (a semiconductor integrated circuit), may be referred to as a "semiconductor chip". Meanwhile, for example, the microcomputer 100 can be integrated with at least one of the PMIC 300, one or more sensor devices 400, the nonvolatile memory 500, and the network device 600 on a single silicon die; and can be configured with a single-chip IC. For example, the microcomputer 100, one or more sensor devices 400, and the nonvolatile memory 500 can be configured with a single-chip IC; or the microcomputer 100 and one or more sensor devices 400 can be configured with a single-chip IC; or the microcomputer 100 and the nonvolatile memory 500 can be configured with a single-chip IC. The single-chip IC configured in the above-mentioned manner may be also referred to as the "semiconductor chip".

Meanwhile, the programs executed by the processor core 101 can be saved as downloadable files on a computer connected to the Internet or can be made available for distribution through a network such as the Internet. Alternatively, the programs executed by the processor core 101 can be stored in advance in a computer-readable storage medium such as a ROM, a CD, a DVD, or the like, and provided as a computer program product.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing device comprising:
    a data obtaining unit configured to obtain sensor data measured by a sensor; and
    a data storage controller configured to
        store the sensor data in a first memory of volatile nature when a sampling interval is equal to or smaller than a threshold value, and
        wherein data stored in the first memory is first data, store the sensor data and the first data in a second memory of nonvolatile nature when the sampling interval exceeds the threshold value;
    a time obtaining unit configured to obtain a time at which the data obtaining unit obtains the sensor data every time when the data obtaining unit obtains the sensor data; and
    a calculator configured to calculate the sampling interval from a difference between a latest time obtained by the time obtaining unit and a previous time to the latest time.

2. The device according to claim 1, further comprising a setting unit configured to set the sampling interval in accordance with the sensor data.

3. The device according to claim 1, further comprising:
a receiver configured to receive an instruction for changing the sampling interval; and
a setting unit configured to set the sampling interval in accordance with the instruction received by the receiver.

4. A semiconductor chip comprising:
a data obtaining unit configured to obtain sensor data measured by a sensor; and
a data storage controller configured to
store the sensor data in a first memory of volatile nature when a sampling interval indicating an interval at which the data obtaining unit obtains the sensor data is equal to or smaller than a threshold value, and
wherein data stored in the first memory is first data, store the sensor data and the first data a second memory of nonvolatile nature when the sampling interval exceeds the threshold value;
a time obtaining unit configured to obtain a time at which the data obtaining unit obtains the sensor data every time when the data obtaining unit obtains the sensor data; and
a calculator configured to calculate the sampling interval from a difference between a latest time obtained by the time obtaining unit and a previous time to the latest time.

5. An information processing method comprising:
obtaining sensor data measured by a sensor;
storing the sensor data in a first memory of volatile nature when a sampling interval indicating an interval at which the sensor data is obtained is equal to or smaller than a threshold value; and
wherein data stored in the first memory is first data, storing the sensor data and the first data in a second memory of nonvolatile nature when the sampling interval exceeds the threshold value;
obtaining a time at which the data obtaining unit obtains the sensor data every time when obtaining the sensor data; and
calculating the sampling interval from a difference between a latest time obtained and a previous time to the latest time.

6. A computer program product comprising a non-transitory computer-readable medium containing a program executed by a computer, the program causing the computer to execute:
obtaining sensor data measured by a sensor;
storing the sensor data in a first memory of volatile nature when a sampling interval indicating an interval at which the sensor data is obtained is equal to or smaller than a threshold value; and
wherein data stored in the first memory is first data, storing the sensor data and the first data in a second memory of nonvolatile nature when the sampling interval exceeds the threshold value;
obtaining a time at which the data obtaining unit obtains the sensor data every time when obtaining the sensor data; and
calculating the sampling interval from a difference between a latest time obtained and a previous time to the latest time.

* * * * *